United States Patent [19]

Varga et al.

[11] 3,798,035

[45] Mar. 19, 1974

[54] METHOD OF MAKING FLEXIBLE PRINTING PLATES

[75] Inventors: Richard S. Varga, Akron; Thomas R. Szczepanski, Royalton, both of Ohio

[73] Assignee: The B. F. Goodrich Company, New York, N.Y.

[22] Filed: Oct. 6, 1972

[21] Appl. No.: 290,399

[52] U.S. Cl. ................. 96/35.1, 96/36.3, 96/115 R, 204/159.15

[51] Int. Cl. ........................... G03c 5/00, G03f 7/00

[58] Field of Search ................ 96/36.3, 35.1, 115 R; 204/159.15

[56] References Cited

UNITED STATES PATENTS

| | | | |
|---|---|---|---|
| 2,399,208 | 4/1946 | Coolidge | 96/115 R |
| 2,484,529 | 10/1949 | Roedel | 96/115 R |
| 3,014,799 | 12/1961 | Oster | 96/35.1 |

*Primary Examiner*—David Klein

*Attorney, Agent, or Firm*—A. C. Doxsey

[57] ABSTRACT

Soluble, crystalline, low molecular weight ethylene-vinyl acetate copolymers are sensitized, typically with aromatic ketones, and can be insolubilized by exposure to U.V. light (3,200–3,800A) which selectively cures the exposed areas. Uncured material is removed by cold solvent wash leaving exposed area as a raised surface. Plates for flexographic printing are prepared from these materials by this process.

3 Claims, No Drawings

METHOD OF MAKING FLEXIBLE PRINTING PLATES

BACKGROUND OF THE INVENTION

Letterpress is a major method employed to produce print copy. Flexography is a branch of letterpress printing using a rotary press, flexible rubber plates and rapid drying ink. Rubber plates are presently made by molding calendered sheet against a thermoset matrix which, in turn, is usually made from a metal engraving. The area that is not to be printed may be relieved to a depth of up to about 35 mils and is generally relieved at least 15 mils. The printing industry has need for more readily produced, lower cost etched surfaces with improved detail suitable for use as flexible printing plates.

SUMMARY OF THE INVENTION

This invention relates to a method of producing flexible, etched, printing plates from photosensitive ethylene-vinyl acetate copolymer compositions. The improved plates of this invention are produced by a process which eliminates the need of first producing a metal plate and a master plate mold. The ethylene-vinyl acetate copolymers, which are normally insensitive to light, are treated with aromatic ketones or other known sensitizers, which make the compositions amenable to crosslinking by light, and with a crosslinking curative. The polymers are then shaped into the three dimensional form of a printing plate. A combination of impinging light, the sensitizer and the curative acts to crosslink the exposed surface portion of the copolymer plate causing the polymer at those points to become harder and insoluble in solvents. The extent of crosslinking diminishes as depth from the exposed surface increases. Uncrosslinked areas of the plate surface are then removed by a cold solvent wash to a desired depth leaving the exposed, crosslinked portions in sharp relief as raised surfaces. Increased commercial versatility and utility are achieved by producing flexible printing plates in accordance with this invention. Selection of the proper ethylene-vinyl acetate copolymer and the use of cold solvent in the wash step are elements of this invention which are asserted to be new to the art.

DETAILED DESCRIPTION OF THE INVENTION

The ethylene-vinyl acetate copolymers useful in this invention are prepared according to procedures known in the art. They are preferably those which contain about 18 to 44 percent by weight, more preferably those which contain 18 to 40 percent by weight, polymerized vinyl acetate content. They are crystalline in structure. At about 44 weight percent vinyl acetate these copolymers become amorphous and rubbery rather than crystalline. The higher the weight percent content of vinyl acetate, the softer the printing plate sheet structure that is ultimately formed. At levels of weight percent vinyl acetate of 50 or more, a plate structure can be extruded, but it exhibits an unsatisfactory rate of cold flow. When the weight percent vinyl acetate in the copolymer is 28 to 44, the associated property of melt index (as measured by ASTM D–1238-62) can range from below 2 to about 1,000, measured in grams/10 minutes, but when the weight percent vinyl acetate is less than 28, the melt index must be 20 or greater for the polymer to have satisfactory properties in a flexible printing plate structure. In general, the higher the melt index, the more flexible the final plate tends to be. Polymers with very low weight percent vinyl acetate (below about 10) and low melt index (below about 20) are too resistant to solvent wash out to be useful in the forming of flexible printing plates in the practice of this invention. The density of the useful copolymers ranges from 0.928 to 0.970.

Copolymerization of ethylene and vinyl acetate is shown in U.S. Pat. Nos. 2,200,429, 2,342,400 and 2,947,735. The copolymers for this invention may be prepared by polymerizing mixtures of the corresponding monomers using polymerization-grade monomers and apparatus, procedures and conditions as shown in the known art for high pressure polymerization of ethylene. The polymerization may be carried out either in tubular or autoclave reactors at pressures from 15,000 to 35,000 p.s.i. or higher, and at temperatures of 300° to 550° F. Commercially available catalysts may be used at conventional concentrations. Peroxygen catalysts such as diethyl peroxide, hydrogen peroxide, lauroyl peroxide, alkali metal and alkaline earth metals are useful when used in the range of 5 to 2,000 p.p.m. (calculated as oxygen).

It is within the state of the art to synthesize either an ethylene-vinyl acetate copolymer of a given molecular weight and a wide range of weight proportions of vinyl acetate, or a copolymer with a given weight percent vinyl acetate and a wide range of molecular weights and melt indexes. The ethylene-vinyl acetate copolymers most useful in this invention have vinyl acetate content of about 18–40 weight percent and are fairly low in molecular weight, in the range 10,000 or lower, but not so low as to be liquids, say in the range 3,000 or lower. The major criteria in selecting the ethylene-vinyl acetate copolymer are that if the weight percent vinyl acetate is in the range 28 to 44, the corresponding melt index should be about 2 or more g/10 minutes as measured by ASTM D–1238-62, and if the said weight percent of vinyl acetate is in the range 18 to 27, the corresponding melt index should be a minimum of 20.

The sensitizer and curative are preferably mixed with the ethylene-vinyl acetate copolymer before a plate is formed. The compositions are readily extruded through a sheet die to form flexible sheets from about 5 mils to about 150 mils thick. The thickness of the sheet determines the thickness of the flexible plate, although a backer layer may be used if desired. The sheet is trimmed to the size of the plate which is desired. Combination of copolymer sensitizer and curative in this manner eliminates the need for the customer to add the sensitizer and curative with attendant chance for compounding errors. The additives can also be applied as a coating to the polymer sheet by brushing, wiping, and the like, from a fluid solution or dispersion. In an alternate procedure the sensitizer and curative are dissolved or dispersed in a fluid which is a solvent for the particular copolymer being used. The copolymer is then dissolved in the solvent and the entire composition is cast on to a nonadhering substrate in wet film form to any desired thickness. The solvent is removed leaving a dry, sensitized, flexible film from about 5 to 50 mils or more thick.

Useful sensitizers to ultra violet radiation for the ethylene-vinyl acetate copolymers include cyanines, triphenyl methane dyestuffs and dyestuffs of the benzanthrone, quinone, and anthraquinone series. Sensitizers of the aromatic ketone type include benzophenone, fluorenone, benzoin, anthraquinone and Michler's ketone. Some naphthathiazolines, pyrazolines, 4H-quinazolin-4-one, methylene blue, benzyl disulfide and divinyl benzene are also useful. The sensitizing agent is activatable by actinic light. It must be soluble in the overall composition or capable of being uniformly dispersed therethrough. At least about 0.5 up to 20 weight parts, preferably, about 2 to 12 weight parts, of sensitizer should be added to 100 weight parts of ethylene-vinyl acetate copolymer.

Cure time for sensitized ethylene-vinyl acetate copolymers, with no curative present, under exposure to ultraviolet light runs about 30 minutes to give a cure depth of 1 to 5 mils.

Addition of a polyfunctional curative cross-linking compound containing at least one terminal ethylenic group reduces this cure time from 30 to about 2 minutes. Materials which can be used in this manner include an alkylene or a polyalkylene glycol polyacrylate prepared from an alkylene glycol of two to 15 carbons or a polyalkylene ether glycol of one to 10 ether linkages. Preferably they have at least one terminal vinylidene group per molecule. The following compounds are further illustrative of this class; unsaturated esters of alcohols, preferably polyols, and particularly such esters of the alpha-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, the bis-acrylates and methacrylates of polyethylene glycols of molecular weight 200–500, and the like. The preferred compounds are trifunctional, but difunctional compounds can also be used. The amount of curative added is about 2 to 10 parts by weight per 100 parts ethylene-vinyl acetate copolymer used.

Sensitized polymeric compounds in plate form are selectively exposed to certain light as described hereinafter. Selective exposure is achieved by transmitting light through a suitable masking means, such as transparencies, photographic negatives, pattern cut-outs, and the like, which permit selective exposure by substantially screening out lightwaves in the range of 3,200 to 3,800 A. in the areas not to be crosslinked. A high contrast negative, for example, has been found to be particularly suitable as a masking means. In Example 3 below a standard test high contrast negative is employed which is divided into twelve squares presenting a full black to white spectrum of horizontal and vertical lines and blocks, circular designs and dotted areas of varying dot densities. This is a standard test element for evaluating half tone print work.

The temperature at the surface being exposed should be from about 32°F. up to about 200°F. and ordinarily should be about 70°F. to 130°F. Light sources emitting substantial amounts of light waves less than 3,200 A. tend to darken the transparency. A protective glass, such as lime glass or pyrex glass, may be placed over the transparency prior to exposure to filter out wavelengths less than 3,200 A. Although the type of light source is not critical, light sources must have at least some light wavelengths ranging from about 3,200 to 3,800 A. Suitable light sources having the desired range of lightwave output include mercury arc lights (AH 6), R.S. Sunlamp (275 watts), medium or high pressure mercury arcs such as Hanovia lamp 679A and Mercury Reprographic lamp H3T7, tubular Metal Halide lamps such as MP–1,500 T4/12B, MG–1500 T4/12B, and MG–1,500T 4U/8M, high intensity fluorescent lamps, and carbon arcs such as Strong Electric lamps of the type used in the graphic arts industry. The light source should preferably have at least about 1 percent of lightwaves produced ranging from about 3,200 A. to about 3,800 A.

Required exposure times to certain light is dependent upon the intensity of the light source, the distance of the plate from the light source and the cross-linking density of the polymer. Exposure times should increse with increased distance between the plate and the light source and with decrease in light intensity and about 2 to 10 minutes exposure times at distances from 4 to 16 inches from the source are generally satisfactory. Light intensity measured at the polymeric surface should be the equivalent of about 1 watt per lineal inch of a tubular exposure lamp. Shorter exposure times of less than 1 minutes may be achieved by exposing sensitized polymers to more intense ultraviolet light sources.

After the sensitized copolymer has been exposed to the cross-linking effect of actinic light, the unexposed and noncross-linked portions of the polymeric matter are removed by solvent washing as with a pressure spray system or in a bath aided by a moderate mechanical brushing means. Suitable developing or washing solvents have good solvent action on the uncured ethylene-vinyl acetate polymer and little or no action on the insolubilized image portion of the plate. Suitable solvents include, for example, chlorinated aliphatic hydrocarbons such as trichloroethylene and methyl chloroform. Toluene and methylethyl ketone are also useful. A brushing means may be used in conjunction with the washing solvents to effectively remove uncross-linked polymeric matter. Cross-linked polymeric portions adjoining the uncross-linked portions are substantially resistant to even vigorous brushing. Desirable brushing means have resilient bristles ranging in stiffness from soft and flexible to semi-rigid. Suitable washing solvents may be utilized in the form of pressure sprays at about 5 to 35 psi and initiating about 6 to 9 inches from the plate being washed, with or without an abrasive, such as fine silica, dispersed therein. It is critical to the success of the invention that removal of uncross-linked copolymer be accomplished with cold wash solvent. The solvent temperature preferably is from 0° to 15°C. When solvent at temperatures above 15°C. is employed to remove uncross-linked polymer, the insoluble cross-linked copolymer areas which are unaffected by the colder solvent tend to develop rounded edges at the joint lines of cross-linked and uncross-linked material and the resultant printing plate lacks sharpness and definition when images are reproduced. The action of solvents varies slightly from solvent to solvent, which offers a means of controlling the wash out procedure and the washout depth attained thereby. For the ethylene-vinyl acetate plate prepared as shown in Example 1 below, a 25 psi spray of methyl chloroform at 10°C washes out unexposed polymer at a rate of 1 to 2 mils per minute, whereas a spray of trichloroethylene at 10° C. and 25 psi washes out the unexposed plate areas at a rate of 4 to 5 mils per minute. With plates prepared from the polymers disclosed herein, a wash time of 4 minutes, using trichloroethylene spray at 5°C., initiating 7 inches from the plate at 30 psi, will always produce a wash out depth greater than the 15 mils required for good print work. Sometimes shorter wash times will be effective. A useful practice has been to divide the 4 minute wash time into two 2-minute wash times with an inspection of the plate between washes. The examination of the plate at the 2 minute interval will tell the operator whether he can shorten the overall wash to less than 4 minutes and still achieve a satisfactory plate.

After the cross-linked polymeric matter is removed by the solvating process, the etched products are dried to remove the washing solvents and may then be used in the printing process. Dried flexible printing plates may have printing ink applied thereto and are suitable for reproducing printed copy. They can be used in hand stamps or on high speed presses.

A wide variety of photosensitive polymers has been shown in the art for preparing printing negatives and rigid plates but this invention is the first to disclose the use of normally light insensitive low molecular weight ethylene-vinyl acetate copolymers to form flexible printing plates. The copolymers, properly sensitized, may be cross-linked or insolubilized by exposure to U.V. light (3,200–3,800 A). Rapid exposure times are possible, leading to an economic process for producing printing plates for flexographic printing.

The scope of this invention is illustrated, but not limited, by the following Example.

EXAMPLE 1

An ethylene-vinyl acetate copolymer, 24 weight percent vinyl acetate, 76 weight percent ethylene, having a 700 melt index and a density of 0.935, available as Ultrathene S–1626 from U.S. Industrial Chemicals Company, division of National Distillers & Chemical Corporation, is used.

A Henschel mixer is employed to mix 100 parts copolymer for 2 minutes at 100°F. Then 3 parts trimethylol propane triacrylate and 10 parts benzophenone, based on the parts of copolymer, are added and mixed for 5 minutes.

The mixture is run through a Prodex 2½ inch extruder, employing a polyethylene screw and a sheet die. A clear, non-porous sheet is produced with a thickness of 100 mils. To protect the reverse side of the sheet during the later washing step, the said reverse side of the sheet is exposed to U.V. light from a Metal Halide MG–1,500T 4U/8M lamp placed at 16 inches distance from the plate for 2 minutes. This exposure makes the reverse side surface cured and solvent resistant.

The sheet is now in the form of an unexposed flexible printing plate. A piece 6 by 6 inches is cut out, placed in a jig, covered with a high contrast photographic negative and exposed for 10 minutes to U.V. light from a Metal Halide MG–1,500T 4U/8M lamp through the negative at a distance of 16 inches.

The exposed plate is washed with a 30 psi spray of cold trichloroethylene at 5°C. for 2 minutes. The plate is air dried and again spray washed with the trichloroethylene at 5° C. and 30 psi for 2 minutes. The spray heads are 7 inches from the plate as it is washed.

Where the U.V. light passed through the negative and impinged on the plate surface, the surface is cured and is not affected by the solvent under these conditions. Where the plate surface is not exposed through the negative, the uncured plate copolymer dissolves and washes away from the surface. Longer exposure time to the wash solvent will give greater depth of plate washout. This double 2 minute spray washout gives a total depth of 30 mils. The raised portion of the plate has clean, well-defined, sharp edges. Next the plate top surface is fully exposed to U.V. light from a Metal Halide MG–1,500 4U/8M lamp at 16 inches for 5 minutes and the uncured areas including the vertical surfaces formed by the washout are cured. Final Shore Durometer A hardness is 65.

The plate is receptive to and resists erosion from water and alcohol based inks. The plate is placed on a multicolor central impression Kidder press and a run of 60,000 three color impressions on polyethylene is made with alcohol based inks. The plate gives sharp, well-defined impressions throughout the run. When cleaned the plate shows no cracks or other evidence of deterioration.

EXAMPLE 2

The procedure of Example 1 is followed with the exception that the ethylene-vinyl acetate copolymer is characterized by being a crystalline material, 19 percent vinyl acetate by weight, density 0.940 and melt index of 425. The printing plate produced is still flexible enough to employ with the Kidder press, but is more stiff than the plate produced in Example 1. Printing quality and useful life of the stiffer plate are comparable to those of the plate produced in Example 1. The Shore Durometer A hardness of this plate is 85.

EXAMPLE 3

Following the procedure of Example 1 similar plates are formed from a range of ethylene-vinyl acetate copolymers having the characteristics listed in the table below.

These plates are evaluated by fully exposing the reverse side to U.V. light for 2 minutes as in Example 1. The face side of the plate is exposed to U.V. light for 10 minutes through a high contrast black and white test negative. Each exposed plate is given two 2 minute washes with 5°C. trichloro-ethylene at 30 psi as in Example 1. The dried plate is checked for sharpness of the edges of the raised areas that remain after the washout and for the depth of washout achieved. A minimum washout depth of 15 mils is needed for successful print work.

Table I

| Plate | Weight Percent: Vinyl Acetate | Melt Index g/10 min. | Density g/cc | Wash out depth -mils |
|---|---|---|---|---|
| A. | 9 | 9 | .928 | less than 5 |
| B. | 14 | 7.5 | .932 | less than 5 |
| C. | 19 | 425 | .940 | greater than 15 |
| D. | 20 | 400 | .940 | greater than 15 |
| E. | 20 | 1.5 | .941 | less than 5 |

Table I—Continued

| Plate | Weight Percent: Vinyl Acetate | Melt Index g/10 min. | Density g/cc | Wash out depth -mils |
|---|---|---|---|---|
| F. | 20 | 20 | .941 | greater than 15 |
| G. | 20 | 3 | .950 | less than 5 |
| H. | 28 | 22 | .950 | greater than 15 |
| I. | 28 | 400 | .950 | greater than 15 |
| J. | 30 | 128 | .950 | greater than 15 |
| K. | 31 | 24 | .960 | greater than 15 |
| L. | 38 | 2 | .962 | greater than 15 |
| M. | 40 | 10 | .970 | greater than 15 |

All plates with satisfactory depth of washout also had satisfactory edge sharpness at the edges of the non-washed out portions of the plate.

Plates A and B are unsatisfactory in depth of washout achieved because the copolymer melt index is less than 20 and the copolymer vinyl acetate content is less than 20. Plates C, D and F show that with vinyl acetate content of 20 a melt index of 20 to 400 gives a satisfactory printing plate material. Plate E is unsatisfactory at the 20 percent level of vinyl acetate because the melt index is below 20. Plate G shows that even at 28 percent vinyl acetate, low melt index of 3 produces an unsatisfactory structure. Plates H through M illustrate compositions giving satisfactory structures. Plates L and M are particularly interesting in that they show that vinyl acetate content of at least 38 gives a satisfactory plate even with low melt index.

We claim:

1. In a process of forming of flexible printing plate comprising (1) forming a mixture of an ethylene-vinyl acetate copolymer having 18 to 44 weight percent vinyl acetate with a sensitizer for the cure of said copolymer by actinic radiation and with a curative crosslinking agent (2) extruding said mixture into a sheet-shaped plate structure of a thickness of at least 20 mils, (3) selectively exposing said structure to actinic radiation comprising ultraviolet light having wavelengths of about 3,200 to 3,800 A. thereby creating both exposed and cured areas and unexposed and uncured areas on said plate structure, (4) removing any unexposed and uncured plate areas by means of a solvent wash to a depth of at least 15 mils and (5) curing uncured areas exposed by said solvent wash by a second exposure of said structure to said actinic radiation, the improvement wherein the said copolymer is selected so that when the said vinyl acetate weight percent is 27 or less, the corresponding melt index is at least 20 and when said acetate weight percent is 28 or more, the corresponding melt index is greater than 2 and wherein the said solvent wash is conducted with solvent at a temperature of 0° to 15°C.

2. The process of claim 1 wherein the wash solvent is employed as a spray at 0° to 15° C. and 5 to 35 psi at a distance of 6–9 inches from the plate.

3. A process of forming a flexible printing plate comprising 1. extruding a mixture comprising 100 parts crystalline ethylene-vinyl acetate copolymer, said copolymer containing 18 to 44 weight percent vinyl acetate and when said copolymer has a vinyl acetate weight percent of 27 or less, the corresponding melt index is at least 20 and when said vinyl acetate weight percent is 28 or more the corresponding melt index is greater than 2, from 0.5 to 20 parts of a sensitizer, and from 2 to 10 parts of a polyfunctional curative cross-linking agent, to a sheet from 20 mils to 150 mils in thickness;
2. exposing the full reverse surface of said sheet to ultraviolet light (3,200–3,800 A.) to fully cure and insolubilize said reverse surface to a depth of 1 to 5 mils;
3. selectively exposing the front surface of said sheet through a developed high contrast negative, the exposed portions of which do not transmit light, to an ultraviolet light source emitting ultraviolet radiation in the range 3,200–3,800 A. thereby creating exposed and cured areas on said sheet beneath the unexposed portions of said negative and leaving unexposed and uncured areas on said sheet beneath the exposed portions of said negative;
4. washing said exposed sheet in a wash solvent, whereby to remove the surface portions of said sheet which were protected from radiation, said solvent being at a temperature from 0° to 15°C., to achieve a washout depth on the said sheet of at least 15 mils;
5. drying said washed sheet; and,
6. exposing the entire front surface of said sheet to ultraviolet light (3,200–3,800 A.) to cure the portions of said front surface exposed by said wash solvent.

* * * * *